(12) United States Patent
Kuo et al.

(10) Patent No.: US 10,854,604 B1
(45) Date of Patent: Dec. 1, 2020

(54) OFFSET GATE CONTACT

(71) Applicant: QUALCOMM Incorporated, San Diego, CA (US)

(72) Inventors: ChihWei Kuo, Hsinchu County (TW); Haining Yang, San Diego, CA (US); Jun Yuan, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/578,101

(22) Filed: Sep. 20, 2019

(51) Int. Cl.
*H01L 27/092* (2006.01)
*H03K 19/0185* (2006.01)
*H02M 7/515* (2007.01)

(52) U.S. Cl.
CPC ........ *H01L 27/092* (2013.01); *H02M 7/515* (2013.01); *H03K 19/018521* (2013.01)

(58) Field of Classification Search
CPC ... H01L 27/092; H01L 27/088; H01L 27/085; H02M 7/515; H03K 19/018521
USPC .......................................................... 327/214
See application file for complete search history.

(56) References Cited

U.S. PATENT DOCUMENTS

| | | | | |
|---|---|---|---|---|
| 7,894,261 | B1* | 2/2011 | Pesavento | G11C 16/0441 365/185.05 |
| 2014/0042506 | A1* | 2/2014 | Ramberg | H01L 29/0653 257/292 |
| 2016/0322354 | A1* | 11/2016 | Chae | H01L 23/535 |

* cited by examiner

*Primary Examiner* — Tomi Skibinski
(74) *Attorney, Agent, or Firm* — Muncy, Geissler, Olds & Lowe, P.C.

(57) ABSTRACT

Offsetting or modulating the location of a gate between two transistors may achieve a lower power circuit and a higher speed circuit depending on the new location of the gate. In one example, a gate between a PFET transistor and an NFET transistor may be offset towards the PFET transistor to achieve a higher speed circuit than a conventional circuit with the gate located equal distance between the transistors. In another example, a gate between a PFET transistor and an NFET transistor may be offset towards the NFET transistor to achieve a lower power circuit than a conventional circuit with the gate located equal distance between the transistors.

20 Claims, 9 Drawing Sheets

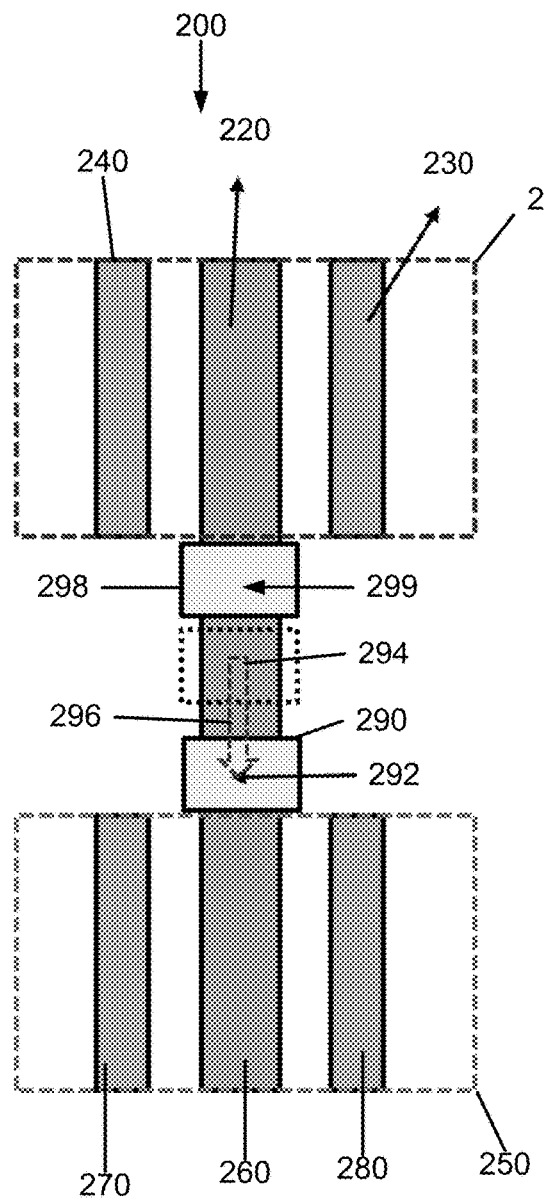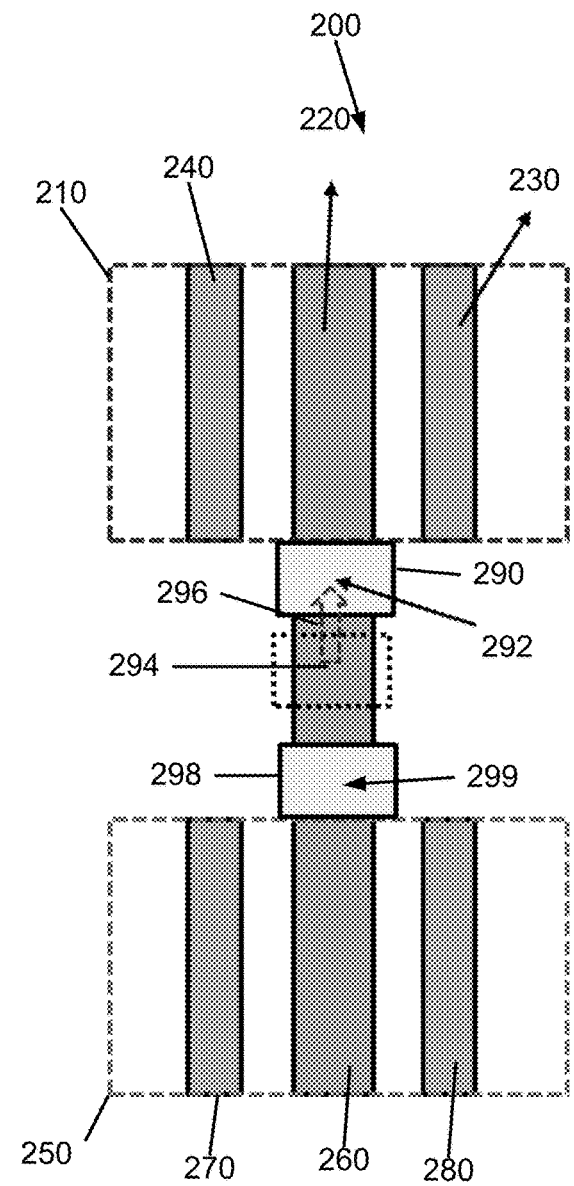
*FIG. 2A*  *FIG. 2B*

OFFSET GATE CONTACT

FIELD OF DISCLOSURE

This disclosure relates generally to transistors, and more specifically, but not exclusively, to a location of a gate contact between at least two transistors.

BACKGROUND

With the increase capabilities and reliance on mobile device, the amount of usage time (battery power versus power consumption rate) is becoming a critical factor. In low power applications, for example, the goal is to utilize low leakage transistors in the circuit to reduce power consumption. In high speed applications, for example, the goal is to utilize larger transistors to increase the circuit speed (less time for each operation) at a trade off with power consumption. In circuits with transistors, the various metal and other layers define the Vth (threshold voltage) of different transistors. For example, a high Vth (HVT), standard or regular Vth (RVT), low Vth (LVT), and ultra or super low Vth (SLVT) name the Vth types from high to low. Accordingly, the fabrication process will be different based on the Vth-type. Usually, several approaches can be used to separate Vth by (1) channel implant (2) gate oxide thickness (3) gate length modulation (4) eWF of metal gate etc. Thus, the front end of line (FEOL) process will be different according to the definition of Vth. However, conventional low power applications relying on scaling and gate length shrinkage encounter speed and performance problems while conventional high speed applications encounter power and performance problems.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a circuit comprises: a first transistor coupled to a supply voltage, the first transistor comprising a gate region, a source contact, and a drain contact; a second transistor coupled to a ground, the second transistor comprising a gate region, a source contact, and a drain contact; and a first gate coupled to the first transistor and the second transistor at a first location, wherein the first location is offset from a center point between the first transistor and the second transistor.

In another aspect, a circuit comprises: a first means for amplifying coupled to a supply voltage, the first means for amplifying comprising a gate region, a source contact, and a drain contact; a second means for amplifying coupled to a ground, the second means for amplifying comprising a gate region, a source contact, and a drain contact; and a first gate coupled to the first means for amplifying and the second means for amplifying at a first location, wherein the first location is offset from a center point between the first means for amplifying and the second means for amplifying.

In still another aspect, a method for forming a circuit comprises: forming a gate region, a source contact, and a drain contact of a first transistor; forming a gate region, a source contact, and a drain contact of a second transistor; and forming a first gate coupled to the first transistor and the second transistor at a first location, wherein the first location is offset from a center point between the first transistor and the second transistor.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIGS. 2A and B illustrate an exemplary double gate circuit in accordance with some examples of the disclosure;

Figure 1A:
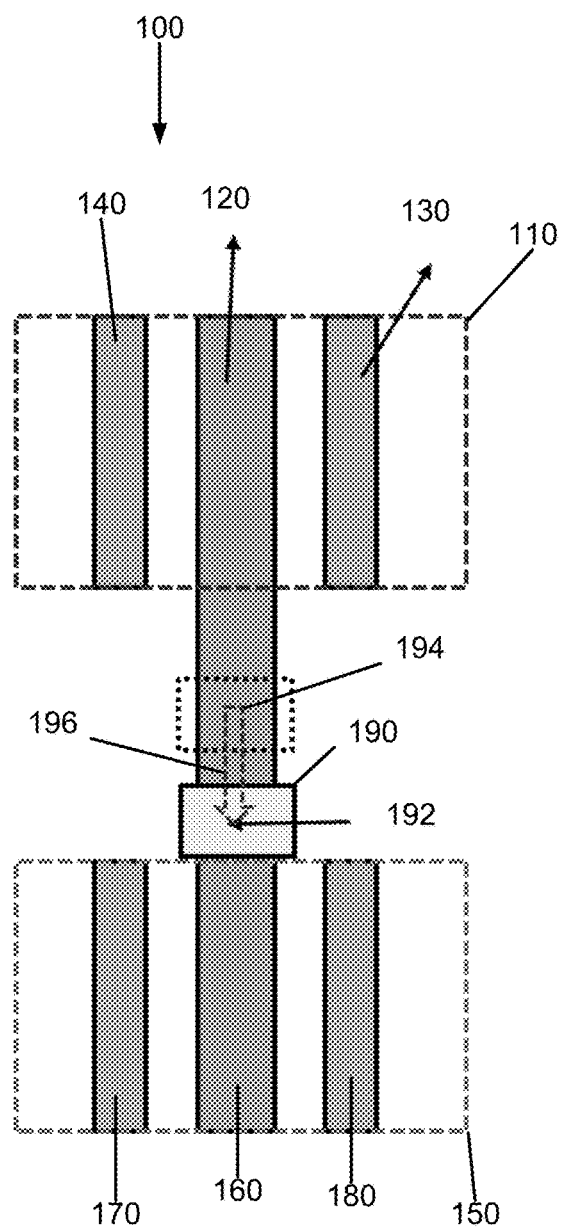
FIGS. 1A and B illustrate an exemplary single gate circuit in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. For instance, with complementary metal oxide semiconductor (CMOS) technology scaling and gate length shrinkage, a gate contact position will also affect the threshold voltage of the transistor (Vth). For example, in an invertor RO circuit when the gate contact is offset from a center position closer to the N type Field Effect Transistor (NFET), both the NFET and the P type Field Effect Transistor (PFET) Vth will increase without mobility degradation. Thus, both of the on current (Ion) and off current (Ioff) will decrease in relation to the Vth increasing. This feature may be used to reduce the leakage current in a circuit for low power application. On the other hand, when gate contact is offset from a center position close to the PFET, both the NFET and the PFET Vth will decrease and cause an increase in Ion and Ioff. Thus, a high speed or low power circuit may be implemented without changing any Front End of Line (FEOL) process. In summary, both a high speed and a low power circuit may be implemented by gate contact position offset or modulation without any FEOL process change.

The FEOL is the first portion of integrated circuit (IC) fabrication where the individual devices (transistors, capacitors, resistors, etc.) are patterned in the semiconductor. FEOL generally covers everything up to (but not including) the deposition of metal interconnect layers. For the CMOS process, FEOL contains all fabrication steps needed to form fully isolated CMOS elements: selecting the type of wafer to be used; chemical-mechanical planarization and cleaning of the wafer; shallow trench isolation (STI) (or LOCOS in early processes, with feature size >0.25 µm); well formation; gate module formation; and source and drain module formation.

The back end of line (BEOL) is the second portion of IC fabrication where the individual devices (transistors, capacitors, resistors, etc.) get interconnected with wiring on the wafer, the metalization layer. Common metals are copper and aluminum. BEOL generally begins when the first layer of metal is deposited on the wafer. BEOL includes contacts, insulating layers (dielectrics), metal levels, and bonding sites for chip-to-package connections. After the last FEOL step, there is a wafer with isolated transistors (without any wires). In BEOL part of fabrication stage contacts (pads), interconnect wires, vias and dielectric structures are formed. For modern IC process, more than 10 metal layers can be added in the BEOL. Steps of the BEOL may include: silicidation of source and drain regions and the polysilicon region; adding a dielectric (first, lower layer is pre-metal dielectric (PMD)—to isolate metal from silicon and polysilicon), CMP processing it; make holes in PMD (make a contact in them); add metal layer 1; add a second dielectric, called the inter-metal dielectric (IMD); make vias through dielectric to connect lower metal with higher metal (vias filled by metal CVD process); repeat above steps to get all metal layers; and add final passivation layer to protect the microchip. After BEOL there is a "back-end process" (also called post-fab), which includes wafer test, wafer backgrinding, die separation, die tests, IC packaging and final test.

FIGS. 1A and B illustrate an exemplary single gate circuit in accordance with some examples of the disclosure. As shown in FIG. 1A, a circuit 100 may include a first transistor 110 coupled to a supply voltage (not shown) and comprising a gate region 120, a source contact 130, and a drain contact 140 (it should be understood that the source and drain contacts are interchangeable depending on the desired transistor type). The circuit 100 may also include a second transistor 150 coupled to a ground (not shown) and comprising a gate region 160, a source contact 170, and a drain contact 180. In addition, the circuit 100 may include a first gate 190 coupled to the first transistor 110 and the second transistor 150 at a first location 192, wherein the first location 192 is offset from a center point 194 between the first transistor 110 and the second transistor 150.

As shown in FIG. 1A, the first location 192 is closer to the second transistor 150 than the first transistor 110. The first location 192 may be offset from the center point 194 by a distance 196 that ranges from approximately 10 nm to approximately 100 nm. As shown, the first transistor 110 is a PFET and the second transistor 150 is an NFET. It should be understood that these positions could be switched or the circuit could contain all PFETs or all NFETs or combinations of multiple PFETs and/or NFETs. It should also be understood that the first transistor 110 and the second transistor 150 may be used in many different types of circuits including, but not limited to, an inverter circuit or a NOR circuit wherein the first transistor 110 may be a pair of PFETs and the second transistor 150 may be a pair of NFETs.

Figure 1B:
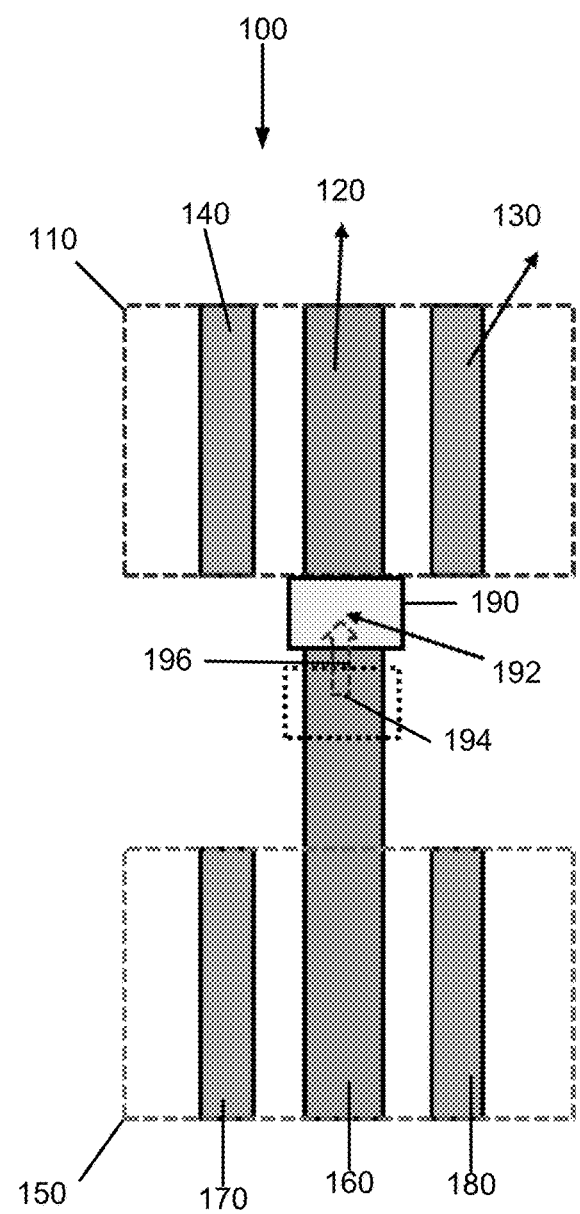

As shown in FIG. 1B, a circuit 100 may include a first transistor 110 coupled to a supply voltage (not shown) and comprising a gate region 120, a source contact 130, and a drain contact 140 (it should be understood that the source and drain contacts are interchangeable depending on the desired transistor type). The circuit 100 may also include a second transistor 150 coupled to a ground (not shown) and comprising a gate region 160, a source contact 170, and a drain contact 180. In addition, the circuit 100 may include a first gate 190 coupled to the first transistor 110 and the second transistor 150 at a first location 192, wherein the first location 192 is offset from a center point 194 between the first transistor 110 and the second transistor 150.

As shown in FIG. 1B, the first location 192 is closer to the first transistor 110 than the second transistor 150. The first location 192 may be offset from the center point 194 by a distance 196 that ranges from approximately 10 nm to approximately 100 nm. As shown, the first transistor 110 is a PFET and the second transistor 150 is an NFET. It should be understood that these positions could be switched or the circuit could contain all PFETs or all NFETs or combinations of multiple PFETs and/or NFETs. It should also be understood that the first transistor 110 and the second transistor 150 may be used in many different types of circuits including, but not limited to, an inverter circuit or a NOR circuit wherein the first transistor 110 may be a pair of PFETs and the second transistor 150 may be a pair of NFETs.

Moving the first gate 190 closer to the NFET may result in a reduced leakage current (i.e., Ioff) in the transistors that will lower the power consumption of the circuit 100. Moving the first gate 190 closer to the PFET may result in an increase in the on current (i.e., Ion) and a resulting increase in speed.

FIGS. 2A and B illustrate an exemplary double gate circuit in accordance with some examples of the disclosure. As shown in FIG. 2A, a circuit 200 may include a first transistor 210 coupled to a supply voltage (not shown) and comprising a gate region 220, a source contact 230, and a drain contact 240 (it should be understood that the source and drain contacts are interchangeable depending on the desired transistor type). The circuit 200 may also include a second transistor 250 coupled to a ground (not shown) and comprising a gate region 260, a source contact 270, and a drain contact 280. In addition, the circuit 200 may include a first gate 290 coupled to the first transistor 210 and the second transistor 250 at a first location 292, wherein the first location 292 is offset from a center point 294 between the first transistor 210 and the second transistor 250. Also, the circuit 200 may include a second gate 298 coupled to the first transistor 210 and the second transistor 250 at a second location 299, wherein the second location 299 is offset from the center point 294 opposite the first location 292.

As shown in FIG. 2A, the first location 292 is closer to the second transistor 250 than the first transistor 210. The first location 292 may be offset from the center point 294 by a distance 296 that ranges from approximately 10 nm to approximately 100 nm. The second location 299 may be approximately offset the same distance 296 as the first location 292 or a different distance. As shown, the first transistor 210 is a PFET and the second transistor 250 is an NFET. It should be understood that these positions could be switched or the circuit could contain all PFETs or all NFETs or combinations of multiple PFETs and/or NFETs. It should also be understood that the first transistor 210 and the second transistor 250 may be used in many different types of circuits including, but not limited to, an inverter circuit or a NOR circuit wherein the first transistor 210 may be a pair of PFETs and the second transistor 250 may be a pair of NFETs.

As shown in FIG. 2B, a circuit 200 may include a first transistor 210 coupled to a supply voltage (not shown) and comprising a gate region 220, a source contact 230, and a drain contact 240 (it should be understood that the source and drain contacts are interchangeable depending on the desired transistor type). The circuit 200 may also include a second transistor 250 coupled to a ground (not shown) and comprising a gate region 260, a source contact 270, and a drain contact 280. In addition, the circuit 200 may include a first gate 290 coupled to the first transistor 210 and the second transistor 250 at a first location 292, wherein the first location 292 is offset from a center point 294 between the first transistor 210 and the second transistor 250. Also, the circuit 200 may include a second gate 298 coupled to the first transistor 210 and the second transistor 250 at a second location 299, wherein the second location 299 is offset from the center point 294 opposite the first location 292.

As shown in FIG. 2B, the first location 292 is closer to the first transistor 210 than the second transistor 250. The first location 292 may be offset from the center point 294 by a distance 296 that ranges from approximately 10 nm to approximately 100 nm. The second location 299 may be approximately offset the same distance 296 as the first location 292 or a different distance. As shown, the first transistor 210 is a PFET and the second transistor 250 is an NFET. It should be understood that these positions could be switched or the circuit could contain all PFETs or all NFETs or combinations of multiple PFETs and/or NFETs. It should also be understood that the first transistor 210 and the second transistor 250 may be used in many different types of circuits including, but not limited to, an inverter circuit or a NOR circuit wherein the first transistor 210 may be a pair of PFETs and the second transistor 250 may be a pair of NFETs.

Moving the first gate 290 closer to the NFET may result in a reduced leakage current (i.e., Ioff) in the transistors that will lower the power consumption of the circuit 200. Moving the first gate 290 closer to the PFET may result in an increase in the on current (i.e., Ion) and a resulting increase in speed. The second gate 298 may be a dummy gate that is not connected to any metal layers above the second gate 298 layer.

Figure 3A:
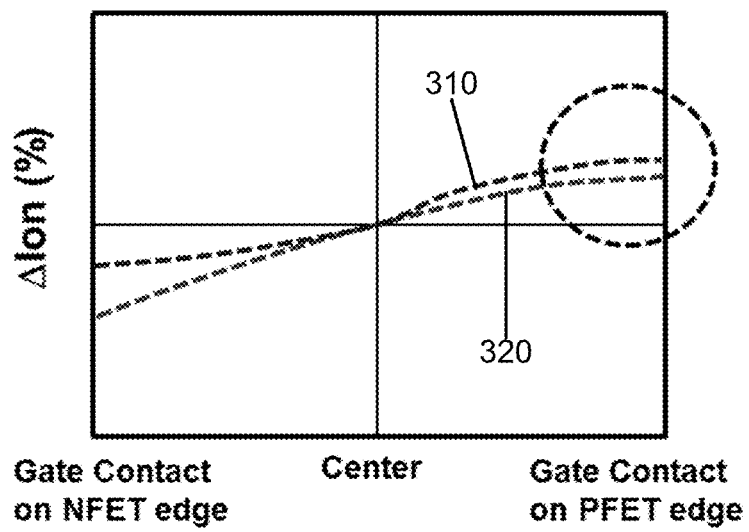
FIGS. 3A-C illustrate performance characteristics of an exemplary circuit in accordance with some examples of the disclosure.
Figure 3B:
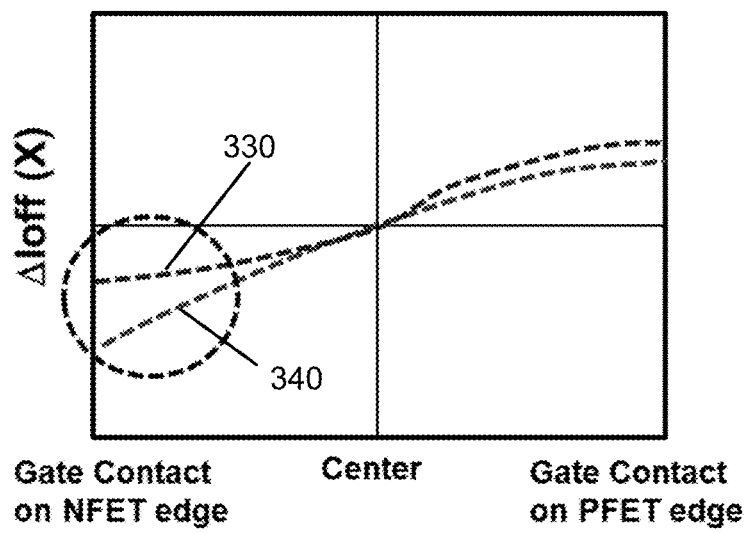
Figure 3C:
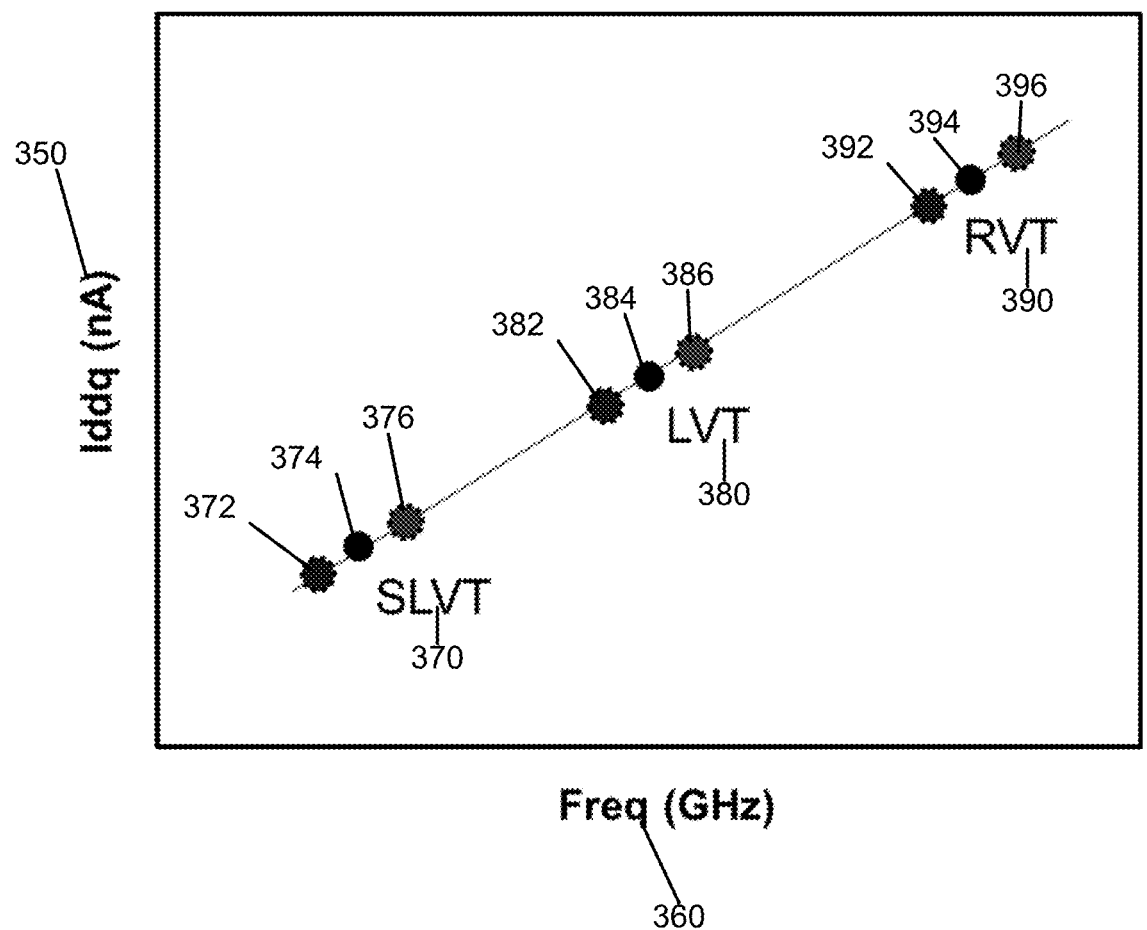

FIGS. 3A-C illustrate performance characteristics of an exemplary circuit in accordance with some examples of the disclosure. As shown in FIG. 3A, as a gate contact (e.g., first gate 190 and first gate 290) is moved closer to the edge of the PFET transistor (closer to the edge or boundary of the active gate region) (e.g., first transistor 110 and first transistor 210), the on current (Ion) 310 of the PFET increases resulting in a higher speed circuit than a circuit with a lower Ion. In addition, the Ion 310 of the PFET is above the increase in the Ion 320 of the NFET (e.g., second transistor 150 and second transistor 250). The results of the opposite positioning of the gate contact are shown in FIG. 3B. As shown in FIG. 3B, a gate contact (e.g., first gate 190 and first gate 290) is moved closer to the edge of the NFET transistor, the off current (Ioff) 330 of the PFET decreases resulting in a lower leakage current and lower power consumption. In addition, the Ioff 340 of the NFET also decreases. As shown in FIG. 3C, the current Iddq (in nA) 350 response versus Frequency (in GHz) 360 response is shown for a various configurations. In a ultra-low Vth configuration (SLVT) 370, the response 372 shows the result of moving the gate contact closer to the NFET transistor, the response 374 shows the result of locating the gate in the center point, and the response 376 shows the result of moving the gate contact closer to the PFET transistor. In a low Vth configuration (LVT) 380, the response 382 shows the result of moving the gate contact closer to the NFET transistor, the response 384 shows the result of locating the gate in the center point, and the response 386 shows the result of moving the gate contact closer to the PFET transistor. In regular or standard Vth configuration (RVT) 390, the response 392 shows the result of moving the gate contact closer to the NFET transistor, the response 394 shows the result of locating the gate in the center point, and the response 396 shows the result of moving the gate contact closer to the PFET transistor.

Figure 4A:
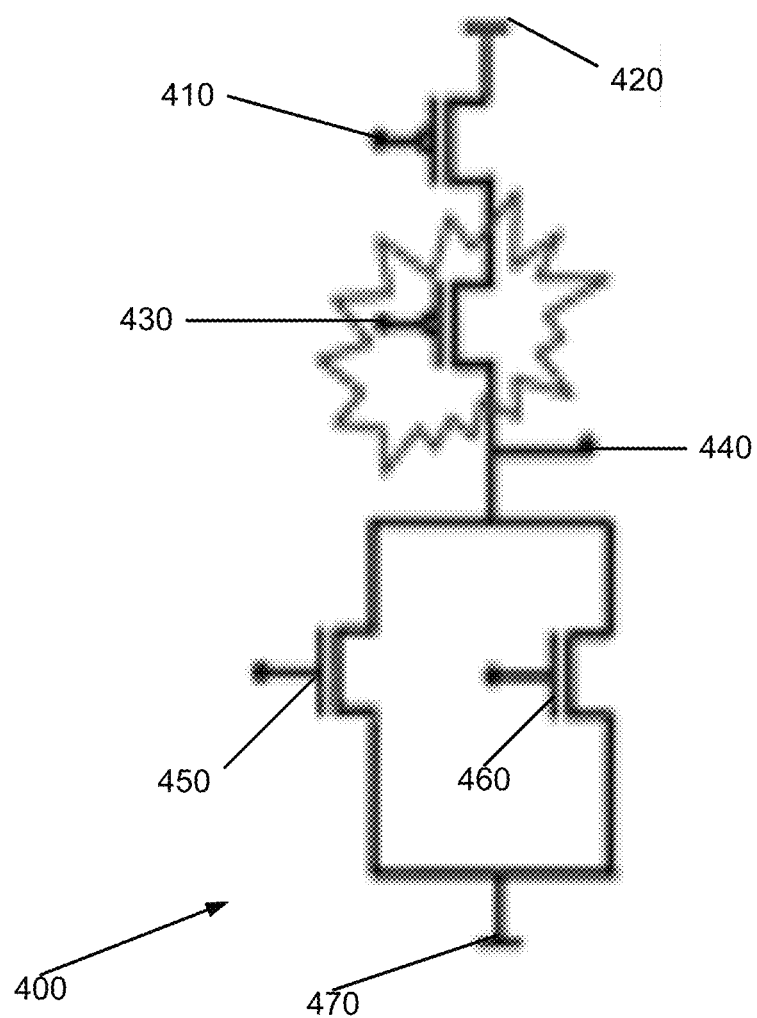
FIGS. 4A and B illustrates exemplary circuits in accordance with some examples of the disclosure.
Figure 4B:
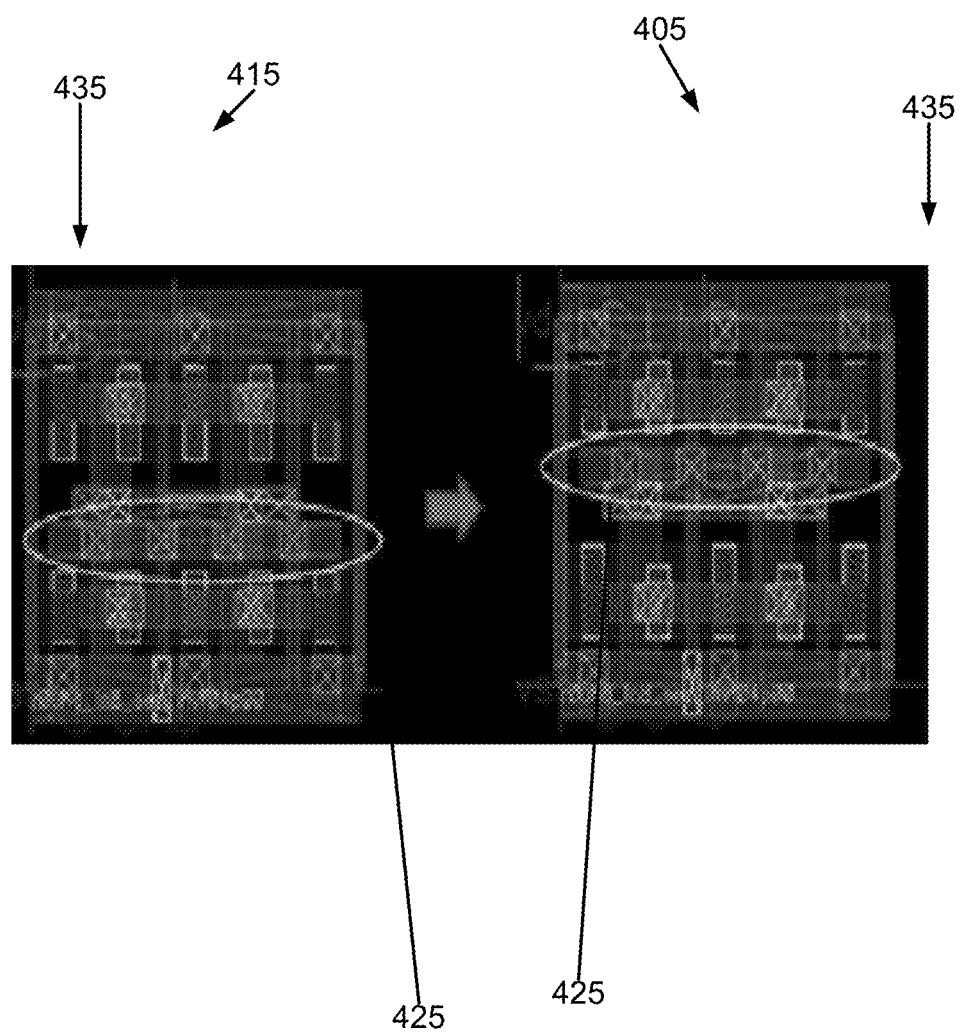

FIGS. 4A and B illustrates exemplary circuits in accordance with some examples of the disclosure. As shown in FIG. 4A, a NOR circuit 400 (e.g., circuit 100 and circuit 200) may include a first PFET transistor 410 coupled to a supply voltage 420, a second PFET 430 in series with the first PFET 410 and coupled to an output node 440 of the NOR circuit 400, a first NFET transistor 450 coupled in parallel with a second NFET 460 both coupled between the output node 440 and a ground 470. In the NOR circuit 400, the resistance of the PFETs 410 and 430 is greater than the resistance of the NFETs 450 and 460. Thus, the two PFETs 410 and 430 act as the pull up transistors for the output node 440 and the two NFETs 450 and 460 act as the pull down transistors for the output node 440. In this configuration, the NOR circuit 400 speed is dominated by the resistance of the PFETs 410 and 430. By locating the gate contact nearer the PFETs 410 and 430, the PMOS current will increase resulting in a lower PFET resistance and a faster speed than conventional configurations (e.g., 7% speed increase). As shown in FIG. 4B, an inverter RO circuit 405 may achieve approximately a 3% speed increase over an inverter RO circuit 415 when the gate contact 425 of circuit 405 is moved closer to the PFET 435 than locating the gate contact 425 of circuit 415 in a center point.

Figure 5:
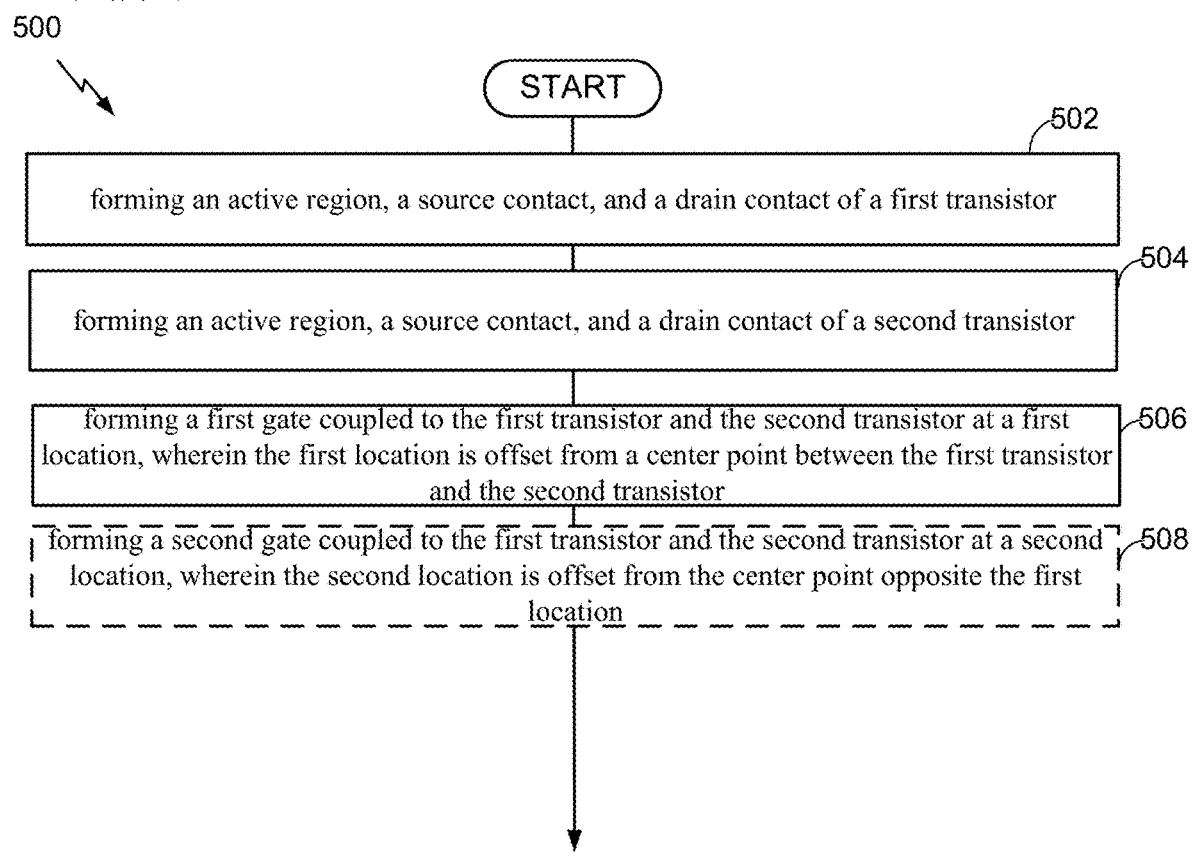
FIG. 5 illustrates an exemplary partial method in accordance with some examples of the disclosure.

FIG. 5 illustrates an exemplary partial method that may be used in accordance with any of the example circuits herein. As shown in FIG. 5, the partial method 500 for forming a circuit may begin in block 502 with forming a gate region, a source contact, and a drain contact of a first transistor. The partial method 500 may continue in block 504 with forming a gate region, a source contact, and a drain contact of a second transistor. The partial method 500 may conclude in block 506 with forming a first gate coupled to the first transistor and the second transistor at a first location, wherein the first location is offset from a center point between the first transistor and the second transistor. Alternatively, the partial method 500 may conclude in block 508 with forming a second gate coupled to the first transistor and the second transistor at a second location, wherein the second location is offset from the center point opposite the first location.

Figure 6:
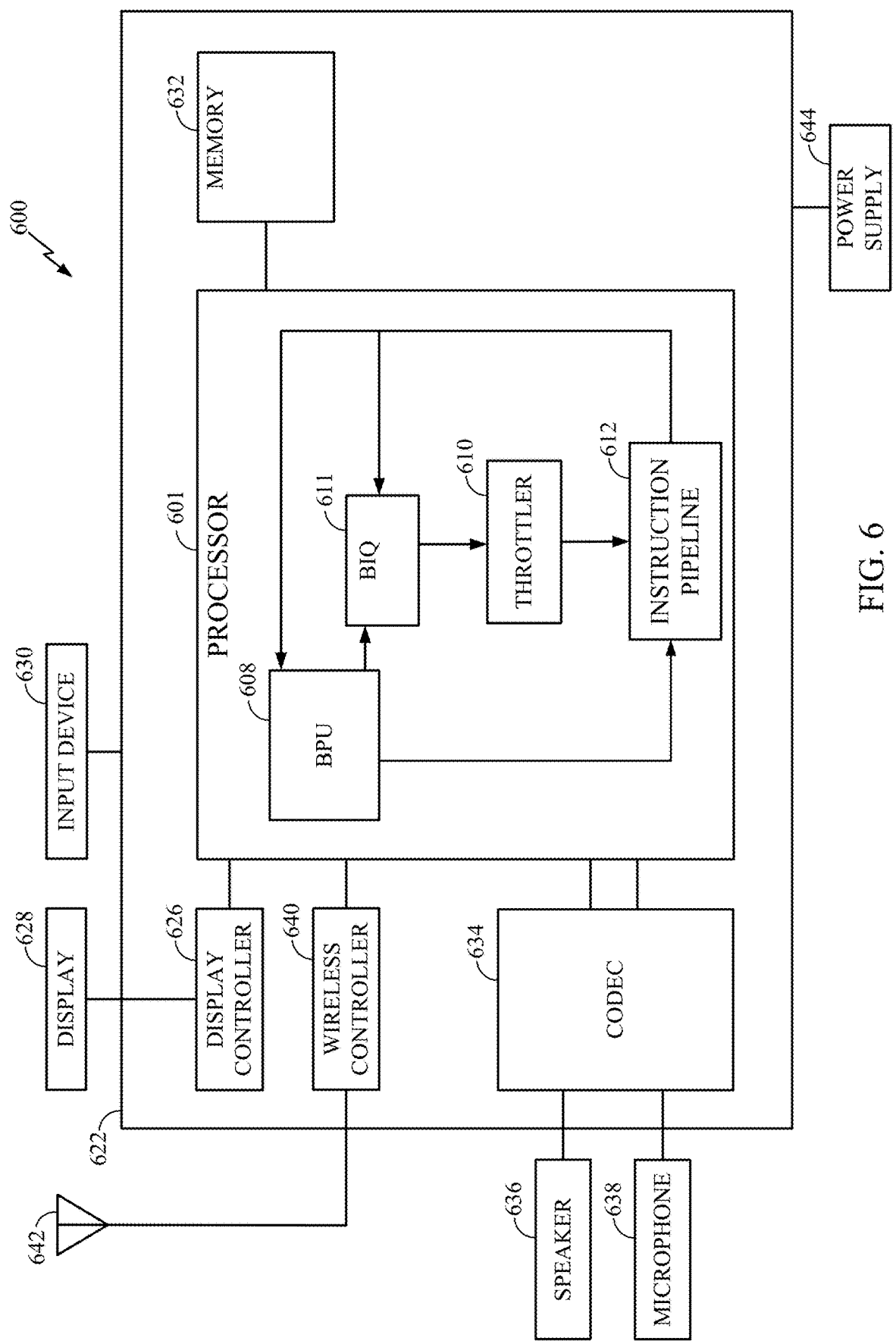
FIG. 6 illustrates an exemplary mobile device in accordance with some examples of the disclosure.

FIG. 6 illustrates an exemplary mobile device in accordance with some examples of the disclosure. Referring now to FIG. 6, a block diagram of a mobile device that is configured according to exemplary aspects is depicted and generally designated 600. In some aspects, mobile device 600 may be configured as a wireless communication device. As shown, mobile device 600 includes processor 601, which may be configured to implement the methods described herein in some aspects. Processor 601 is shown to comprise instruction pipeline 612, buffer processing unit (BPU) 608, branch instruction queue (BIQ) 611, and throttler 610 as is well known in the art. Other well-known details (e.g., counters, entries, confidence fields, weighted sum, comparator, etc.) of these blocks have been omitted from this view of processor 601 for the sake of clarity.

Processor 601 may be communicatively coupled to memory 632 over a link, which may be a die-to-die or chip-to-chip link. Mobile device 600 also include display 628 and display controller 626, with display controller 626 coupled to processor 601 and to display 628.

In some aspects, FIG. 6 may include coder/decoder (CODEC) 634 (e.g., an audio and/or voice CODEC) coupled to processor 601; speaker 636 and microphone 638 coupled to CODEC 634; and wireless controller 640 (which may include a modem) coupled to wireless antenna 642 and to processor 601.

In a particular aspect, where one or more of the above-mentioned blocks are present, processor 601, display controller 626, memory 632, CODEC 634, and wireless controller 640 can be included in a system-in-package or system-on-chip device 622. Input device 630 (e.g., physical or virtual keyboard), power supply 644 (e.g., battery), display 628, input device 630, speaker 636, microphone 638, wireless antenna 642, and power supply 644 may be external to system-on-chip device 622 and may be coupled to a component of system-on-chip device 622, such as an interface or a controller.

It should be noted that although FIG. 6 depicts a mobile device, processor 601 and memory 632 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
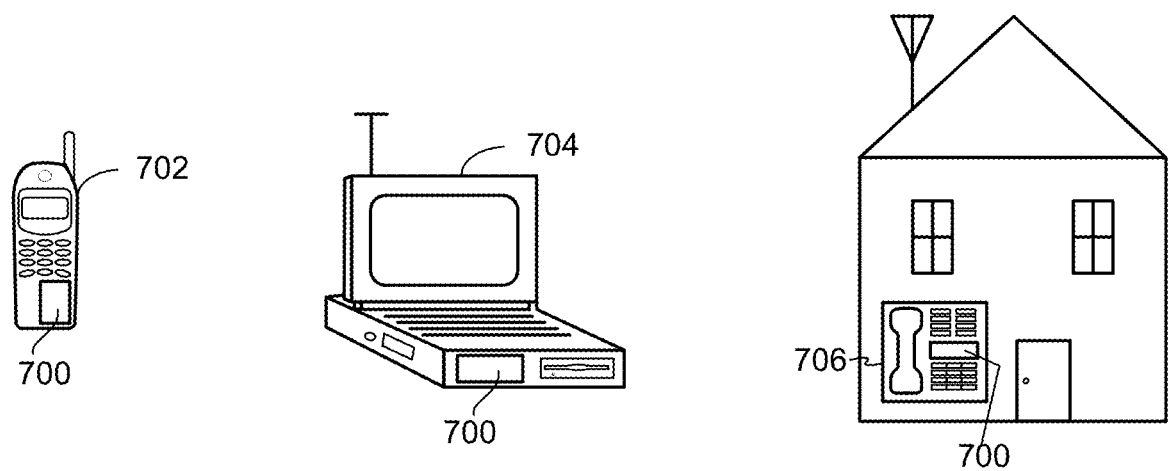
FIG. 7 illustrates various electronic devices that may be integrated with any of the aforementioned integrated device, semiconductor device, integrated circuit, die, interposer, package or package-on-package (PoP) in accordance with some examples of the disclosure.

FIG. 7 illustrates various electronic devices that may be integrated with any of the aforementioned integrated device, semiconductor device, integrated circuit, die, interposer, package or package-on-package (PoP) in accordance with some examples of the disclosure. For example, a mobile phone device 702, a laptop computer device 704, and a fixed location terminal device 706 may include an integrated device 700 as described herein. The integrated device 700 may be, for example, any of the integrated circuits, dies, integrated devices, integrated device packages, integrated circuit devices, device packages, integrated circuit (IC) packages, package-on-package devices described herein. The devices 702, 704, 706 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, a circuit comprises: a first means for amplifying coupled to a supply voltage, the first means for amplifying comprising a gate region, a source contact, and a drain contact; a second means for amplifying coupled to a ground, the second means for amplifying comprising a gate region, a source contact, and a drain contact; and a first gate coupled to the first means for amplifying and the second means for amplifying at a first location, wherein the first location is offset from a center point between the first means for amplifying and the second means for amplifying. It will be appreciated that the aforementioned aspects are merely provided as examples and the various aspects claimed are not limited to the specific references and/or illustrations cited as examples.

One or more of the components, processes, features, and/or functions illustrated in FIGS. 1-7 may be rearranged and/or combined into a single component, process, feature or function or incorporated in several components, processes, or functions. Additional elements, components, processes, and/or functions may also be added without departing from the disclosure. It should also be noted that FIGS. 1-7 and its corresponding description in the present disclosure is not limited to dies and/or ICs. In some implementations, FIGS. 1-7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A circuit comprising:
    a first transistor coupled to a supply voltage, the first transistor comprising a gate region, a source contact, and a drain contact;
    a second transistor coupled to a ground, the second transistor comprising a gate region, a source contact, and a drain contact; and
    a first gate coupled to the first transistor and the second transistor at a first location, wherein the first location is offset from a center point between the first transistor and the second transistor.

2. The circuit of claim 1, wherein the first location is closer to the first transistor than the second transistor.

3. The circuit of claim 1, wherein the first location is closer to the second transistor than the first transistor.

4. The circuit of claim 1, wherein the first transistor is a PFET and the second transistor is an NFET.

5. The circuit of claim 1, wherein the first location is offset from the center point from 10 to 100 nm.

6. The circuit of claim 1, further comprising a second gate coupled to the first transistor and the second transistor at a second location, wherein the second location is offset from the center point opposite the first location.

7. The circuit of claim 1, wherein the first transistor is a PFET and the second transistor is an NFET and the circuit is an inverter circuit.

8. The circuit of claim 1, wherein the first transistor is a pair of PFETs and the second transistor is a pair of NFETs and the circuit is a NOR circuit.

9. The circuit of claim 1, wherein the circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

10. A circuit comprising:
    a first means for amplifying coupled to a supply voltage, the first means for amplifying comprising a gate region, a source contact, and a drain contact;
    a second means for amplifying coupled to a ground, the second means for amplifying comprising a gate region, a source contact, and a drain contact; and
    a first gate coupled to the first means for amplifying and the second means for amplifying at a first location, wherein the first location is offset from a center point between the first means for amplifying and the second means for amplifying.

11. The circuit of claim 10, wherein the first location is closer to the first means for amplifying than the second means for amplifying.

12. The circuit of claim 10, wherein the first location is closer to the second means for amplifying than the first means for amplifying.

13. The circuit of claim 10, wherein the first means for amplifying is a PFET and the second means for amplifying is an NFET.

14. The circuit of claim 10, wherein the first location is offset from the center point from 10 to 100 nm.

15. The circuit of claim 10, further comprising a second gate coupled to the first means for amplifying and the second means for amplifying at a second location, wherein the second location is offset from the center point opposite the first location.

16. The circuit of claim 10, wherein the first means for amplifying is a PFET and the second means for amplifying is an NFET and the circuit is an inverter circuit.

17. The circuit of claim 10, wherein the first means for amplifying is a pair of PFETs and the second means for amplifying is a pair of NFETs and the circuit is a NOR circuit.

18. The circuit of claim 10, wherein the circuit is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

19. A method for forming a circuit, the method comprising:
    forming a gate region, a source contact, and a drain contact of a first transistor;
    forming a gate region, a source contact, and a drain contact of a second transistor; and forming a first gate coupled to the first transistor and the second transistor at a first location, wherein the first location is offset from a center point between the first transistor and the second transistor.

20. The method of claim 19, further comprising forming a second gate coupled to the first transistor and the second transistor at a second location, wherein the second location is offset from the center point opposite the first location.

* * * * *